United States Patent
Kajiya et al.

(10) Patent No.: US 8,545,056 B2
(45) Date of Patent: Oct. 1, 2013

(54) LED FLEXIBLE BOARD ASSEMBLY AND LIGHTING UNIT

(75) Inventors: Atsushi Kajiya, Tokyo (JP); Hidekazu Yoshihara, Tokyo (JP)

(73) Assignee: Nippon Mektron, Ltd., Tokyo (JP)

( * ) Notice: Subject to any disclaimer, the term of this patent is extended or adjusted under 35 U.S.C. 154(b) by 0 days.

(21) Appl. No.: 13/521,651

(22) PCT Filed: Dec. 16, 2011

(86) PCT No.: PCT/JP2011/079159
§ 371 (c)(1),
(2), (4) Date: Jul. 11, 2012

(87) PCT Pub. No.: WO2012/144109
PCT Pub. Date: Oct. 26, 2012

(65) Prior Publication Data
US 2012/0287614 A1    Nov. 15, 2012

(30) Foreign Application Priority Data
Apr. 19, 2011    (JP) .................................. 2011-92708

(51) Int. Cl.
*F21L 4/02*    (2006.01)
*F21L 4/00*    (2006.01)

(52) U.S. Cl.
USPC ........ 362/249.04; 362/189; 362/190; 257/98; 257/99

(58) Field of Classification Search
CPC .......... F21L 4/02; F21L 4/00; H01L 31/0203; G02F 1/13338
USPC ............... 362/189, 190, 235, 249.02, 249.06; 257/99, 787; 313/498, 506, 512; 361/749
See application file for complete search history.

(56) References Cited

U.S. PATENT DOCUMENTS

| | | | | |
|---|---|---|---|---|
| 7,726,836 | B2 * | 6/2010 | Chen ........................ | 362/249.02 |
| D656,111 | S * | 3/2012 | Kajiya et al. ................ | D13/182 |
| D656,112 | S * | 3/2012 | Kajiya et al. ................ | D13/182 |

(Continued)

FOREIGN PATENT DOCUMENTS

| | | |
|---|---|---|
| JP | 2003-59305 | 2/2003 |
| JP | 2006-308738 | 11/2006 |

(Continued)

OTHER PUBLICATIONS

International Search Report of PCT/JP2011/079159 mailed Mar. 19, 2012.

*Primary Examiner* — Tracie Y Green
(74) *Attorney, Agent, or Firm* — Staas & Halsey LLP

(57) ABSTRACT

A lighting unit, e.g. an LED bulb or a straight LED luminaire, which illuminates a wide range and is configured with low cost. In a light-emitting diode lamp, a board assembly is disposed in a lamp main body, and light-emitting diodes are attached to the board assembly. The board assembly comprises a plurality of flexible printed circuit boards. Each flexible printed circuit board includes a base in the form of a flat plate, respective connections to a power supply portion of the light-emitting diode lamp are provided at two ends of the base, and the base is bent at a plurality of points of a middle portion to form a top surface portion and side surface portions. The flexible printed circuit boards are three-dimensionally assembled such that the top surface portions cross each other and such that one of the top surface portions lies on top of another.

9 Claims, 15 Drawing Sheets

(56) References Cited

U.S. PATENT DOCUMENTS

| | | | |
|---|---|---|---|
| 8,314,566 B2 * | 11/2012 | Steele et al. | 315/185 R |
| 2003/0031015 A1 | 2/2003 | Ishibashi | |
| 2004/0252501 A1 | 12/2004 | Moriyama et al. | |
| 2005/0146884 A1 * | 7/2005 | Scheithauer | 362/470 |
| 2005/0174769 A1 * | 8/2005 | Yong et al. | 362/235 |
| 2011/0050073 A1 * | 3/2011 | Huang | 313/46 |
| 2011/0090686 A1 * | 4/2011 | Pickard | 362/235 |
| 2011/0204393 A1 | 8/2011 | Masumoto | |
| 2012/0106153 A1 * | 5/2012 | Huang et al. | 362/249.02 |
| 2013/0114253 A1 * | 5/2013 | Segawa et al. | 362/235 |

FOREIGN PATENT DOCUMENTS

| | | |
|---|---|---|
| JP | 2010-55993 | 3/2010 |
| JP | 2011-54577 | 3/2011 |
| JP | 2011-253782 | 12/2011 |
| WO | WO 02/089222 | 11/2002 |

* cited by examiner

PRIOR ART

PRIOR ART

LED FLEXIBLE BOARD ASSEMBLY AND LIGHTING UNIT

CROSS-REFERENCE TO RELATED APPLICATIONS

This application is a U.S. National Phase application of PCT/JP2011/079159 filed Dec. 16, 2011 and claims the priority benefit of Japanese Application No. 2011-092708 filed Apr. 19, 2011 in the Japanese Intellectual Property Office, the contents of both of which are incorporated herein by reference in their entireties.

FIELD OF THE INVENTION

The present invention relates to a board assembly which comprises a plurality of flexible printed circuit board (FPCs) used in a lighting unit such as an LED bulb or a straight LED luminaire (LED fluorescent lamp) and a lighting unit including the board assembly.

BACKGROUND ART

In recent years, light-emitting diodes (LEDs) have come into use as the light source of a lighting unit. Since a light-emitting diode has a longer life and generates less heat than an incandescent lamp and the like, a plurality of (two or more) light-emitting diodes coupled to each other can be used. As an example, there is proposed the idea of coupling a plurality of light-emitting diodes with a sheet-like conductor to form a strip-like light source coupler (LED module) (see, e.g., Patent Literature 1).

PRIOR ART DOCUMENT

Patent Document 1: International Publication No. WO 2002/08922 pamphlet

SUMMARY OF THE INVENTION

Problems to be Solved by the Invention

A general light-emitting diode, however, applies light with high directivity and has a narrow beam angle. Accordingly, a plurality of light-emitting diodes needs to be arranged so as to face directions different from each other in a lighting unit required to illuminate a wide range. For example, in a lighting unit which emits light equally over 360° in a circumferential direction, such as an electric bulb, a plurality of light-emitting diodes need to be scatteringly arranged in a circumferential direction and in an axial direction. Such a lighting unit thus has the disadvantages of the need for a complex manufacturing process during manufacture of the lighting unit and rising manufacturing costs of the lighting unit.

As a way to overcome the disadvantages, for example, it is conceivable to attach light-emitting diodes (not shown) to a top surface portion 9 and a side surface portion 10 of a frusto-conical flexible printed circuit board 6, as shown in FIG. 10. The idea, however, complicates the shape of the flexible printed circuit board 6 when developed into a plane. If the flexible printed circuit boards 6 are laid out in a material sheet 12, as shown in FIG. 11, the number of flexible printed circuit boards 6 that can be laid out is small (only three in FIG. 11), and the yield from a material is low. Accordingly, the idea does not contribute much to a reduction in manufacturing costs.

The present invention has been made in consideration of the above-described circumstances, and has as its object to provide a lighting unit which can illuminate a wide range and whose manufacturing costs can be reduced and a board assembly which is suitably used while being incorporated in the lighting unit.

Means to Solve the Problem

A board assembly according to the present invention is a board assembly including a plurality of flexible printed circuit boards to which a light-emitting diode is attached and which are used in a lighting unit, wherein each of the flexible printed circuit boards includes a base in the form of a flat plate, respective connections to a power supply portion of the lighting unit are provided at two ends of the base, and the base is bent at a plurality of points of a middle portion to form a top surface portion and side surface portions, and the flexible printed circuit boards have substantially same shapes and are three-dimensionally assembled such that the top surface portions cross each other and such that one of the top surface portions lies on top of another.

In the board assembly according to the present invention, each flexible printed circuit board desirably includes a heat-dissipating layer which is made of copper foil having a tensile strength of 400 MPa or more and a thickness of 70 µl or more.

In the board assembly according to the present invention, it is desirable that a top one of the plurality of flexible printed circuit boards include a light-emitting diode attaching portion to which the light-emitting diode is attached at each of the top surface portion and the side surface portions and that the other flexible printed circuit boards each include a light-emitting diode attaching portion to which the light-emitting diode is attached at each of the side surface portions.

In the board assembly according to the present invention, the light-emitting diode attaching portions of the plurality of flexible printed circuit boards are desirably set such that irradiation areas of the light-emitting diodes overlap with each other at edges when the light-emitting diodes are attached.

In the board assembly according to the present invention, a rib is desirably formed along a side edge of each of the side surface portions in each flexible printed circuit board.

In the board assembly according to the present invention, each flexible printed circuit board desirably includes a top surface portion having a substantially rectangular shape provided at a central portion and the respective side surface portions having a substantially rectangular shape provided so as to extend from two sides of the top surface portion in substantially perpendicular directions.

In the board assembly according to the present invention, each flexible printed circuit board desirably includes a top surface portion having a substantially rectangular shape provided at a central portion and the respective side surface portions having a substantially rectangular shape provided so as to extend from two sides of the top surface portion in directions which form obtuse angles with the top surface portion.

In the board assembly according to the present invention, each flexible printed circuit board desirably includes a top surface portion having a substantially rectangular shape provided at a central portion and the respective side surface portions having a substantially trapezoidal shape provided so as to extend from two sides of the top surface portion in directions which form obtuse angles with the top surface portion, and a gap between adjacent ones of the side surface portions is desirably closed by bringing corresponding edges of the adjacent side surface portions into contact with each other.

A lighting unit according to the present invention includes a board assembly of the present invention disposed in a light unit main body, and the light-emitting diode is attached to the board assembly.

Effect of the Present Invention

In each of a board assembly and a lighting unit according to the present invention, a plurality of light-emitting diode attaching portions are arranged so as to face directions different from each other, and so a wide range can be illuminated with a plurality of light-emitting diodes. Additionally, the shape of a flexible printed circuit board when developed into a plane is simple. This allows an increase in the yield rate of a material and a reduction in the manufacturing costs of the board assembly or lighting unit.

DESCRIPTION OF THE PREFERRED EMBODIMENTS

Embodiments of this invention will be described below.
[First Embodiment]
FIGS. 1 to 4 show a first embodiment of the present invention. In the first embodiment, a light-emitting diode lamp 1 is used as an example of a lighting unit, and a lamp main body 2 is used as an example of a lighting unit main body.

Figure 1:
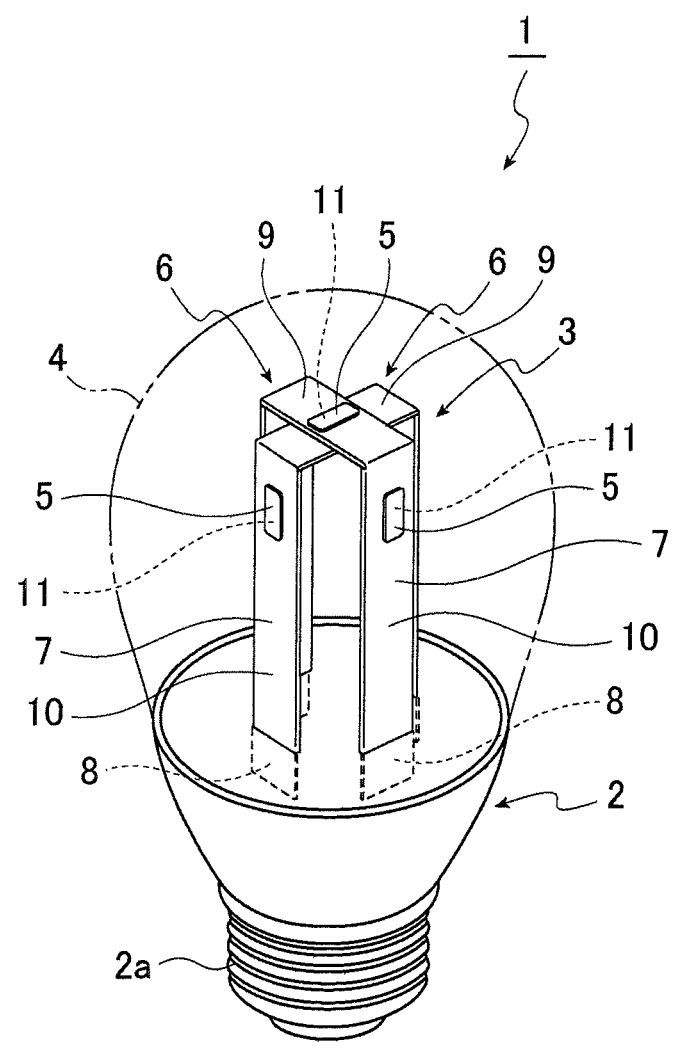
FIG. 1 is a perspective view showing a light-emitting diode lamp according to a first embodiment of the present invention.

As shown in FIG. 1, the light-emitting diode lamp 1 includes the lamp main body 2, and a socket threaded portion 2a is formed at a lower portion of the lamp main body 2. At an upper portion of the lamp main body 2, a board assembly 3 is disposed, and a cover 4 made of a colorless, transparent glass or synthetic resin (or plastic) is attached so as to cover the board assembly 3. Five light-emitting diodes 5 are attached to the board assembly 3 such that the light-emitting diodes 5 can apply light in directions different from each other and such that respective irradiation areas of the light-emitting diodes 5 overlap with each other at edges in a manner corresponding to lighting angles of the light-emitting diodes 5.

Figure 3:
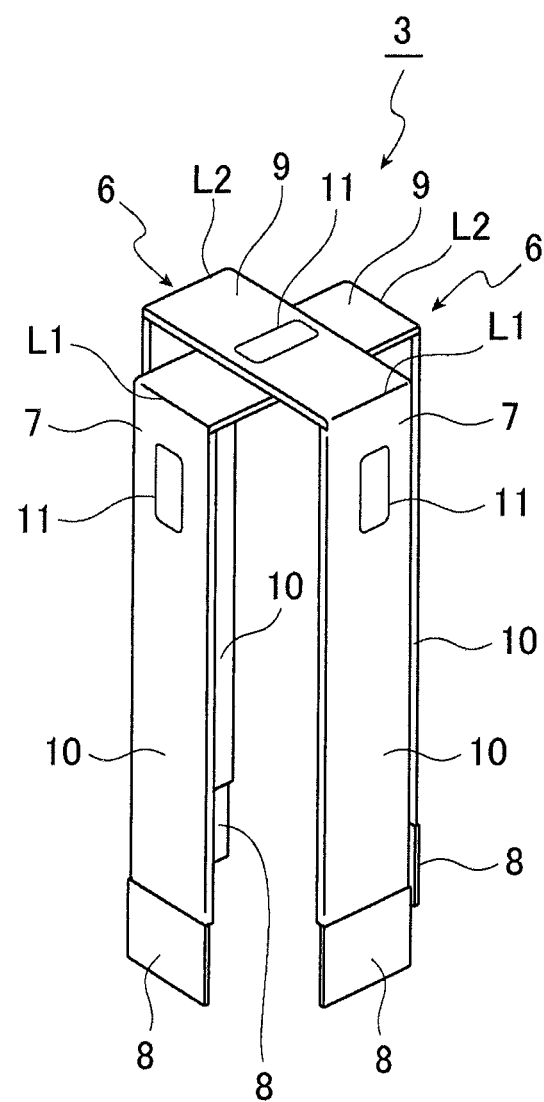
FIG. 3 is a perspective view of a board assembly according to the first embodiment of the present invention.

More specifically, as shown in FIG. 3, the board assembly 3 is composed of two flexible printed circuit boards 6. The flexible printed circuit boards 6 have the same U-shape.

Figure 4:
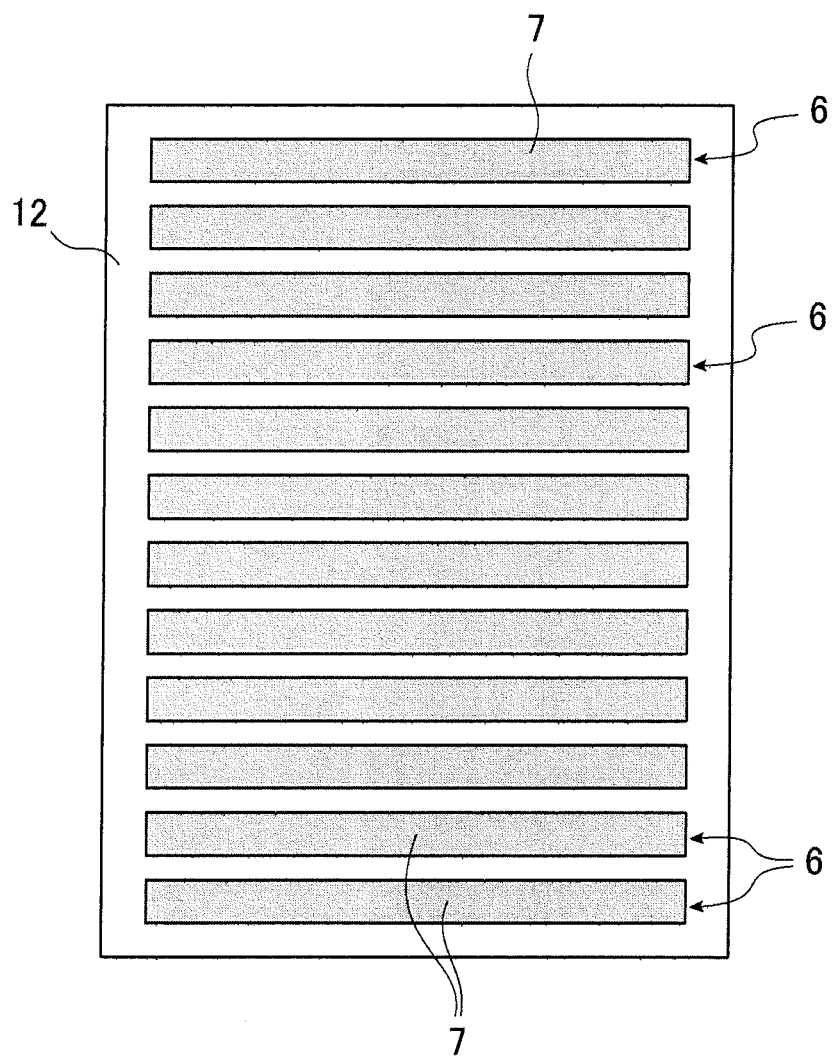
FIG. 4 is a plan view showing how the flexible printed circuit boards shown in FIG. 3 are laid out in a material sheet.

As shown in FIGS. 3 and 4, the flexible printed circuit boards 6 each include a base 7 which is in the form of a flat plate having a substantially rectangular shape (i.e., a simple shape) when developed into a plane. The base 7 includes connections 8 at two ends and is bent substantially at right angles along two bend lines L1 and L2 of a middle portion to form a top surface portion 9 and two side surface portions 10. Note that the two connections 8 can be connected to a power supply portion (not shown) housed in the lamp main body 2.

As shown in FIGS. 1 and 3, the two flexible printed circuit boards 6 are three-dimensionally assembled such that the top surface portions 9 cross each other substantially at right angles and such that one of the top surface portions 9 lies on top of the other to constitute the board assembly 3. The upper flexible printed circuit board 6 includes one light-emitting diode attaching portion 11 at each of respective predetermined positions of the top surface portion 9 and two side surface portions 10, and the respective light-emitting diodes 5 are mounted on the light-emitting diode attaching portions 11. The lower flexible printed circuit board 6 includes one light-emitting diode attaching portion 11 at each of respective predetermined positions of the two side surface portions 10, and the respective light-emitting diodes 5 are mounted on the light-emitting diode attaching portions 11.

Figure 5A:
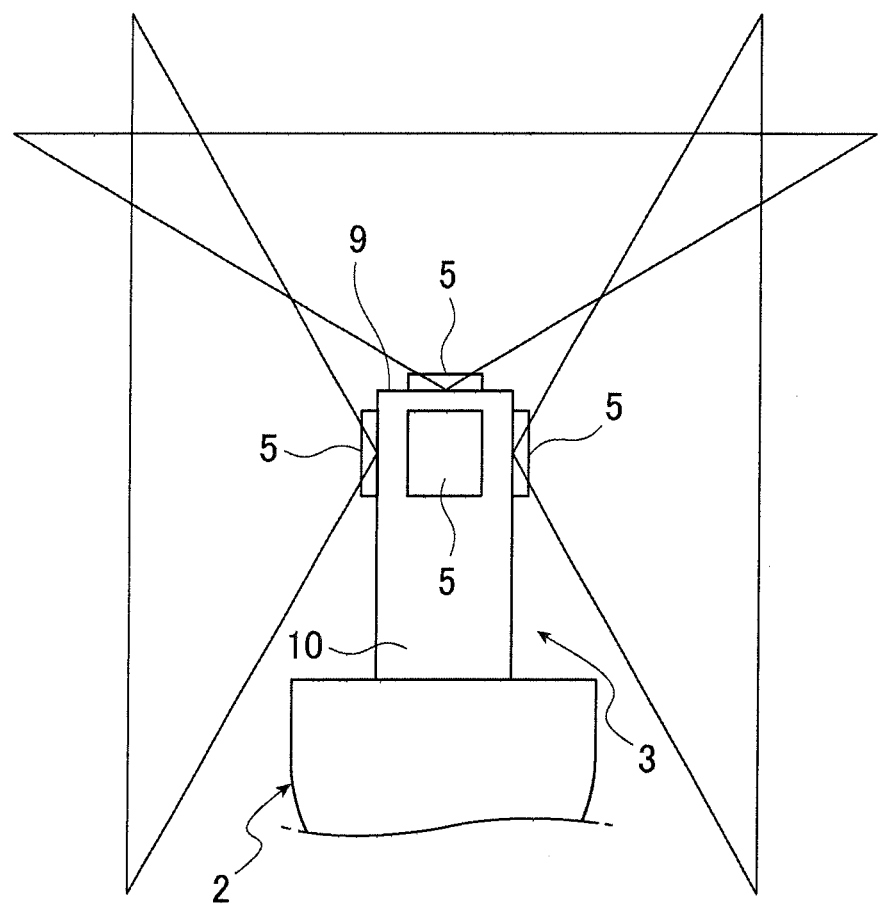
FIG. 5A is a front view schematically showing irradiation areas of the light-emitting diode lamp shown in FIG. 1.
Figure 5B:
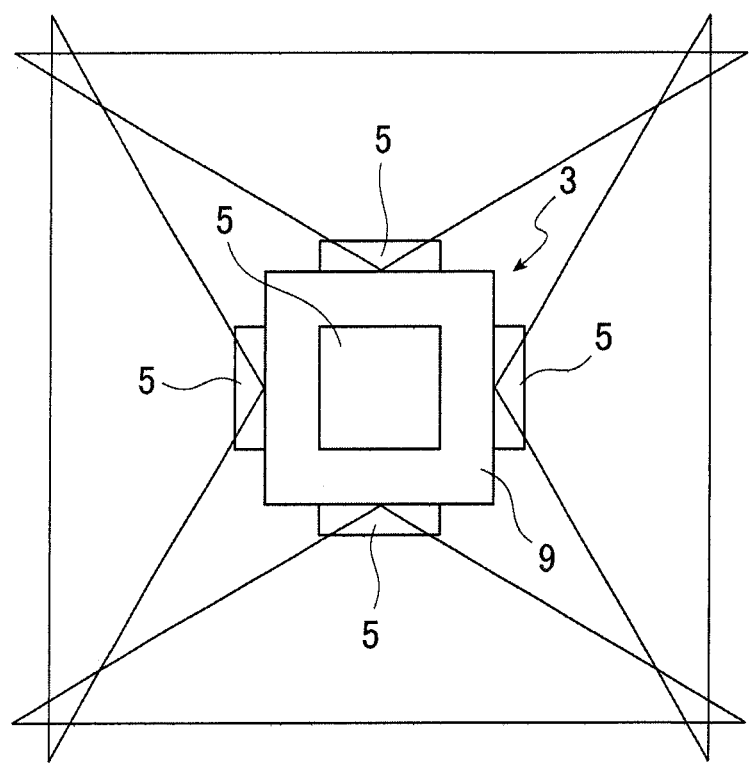
FIG. 5B is a plan view schematically showing the irradiation areas of the light-emitting diode lamp shown in FIG. 1.

For this reason, as shown in FIGS. 5A and 5B, the five light-emitting diodes 5 on the board assembly 3 apply light in the directions different from each other and have the respective irradiation areas overlapping with each other at the edges.

Figure 2:
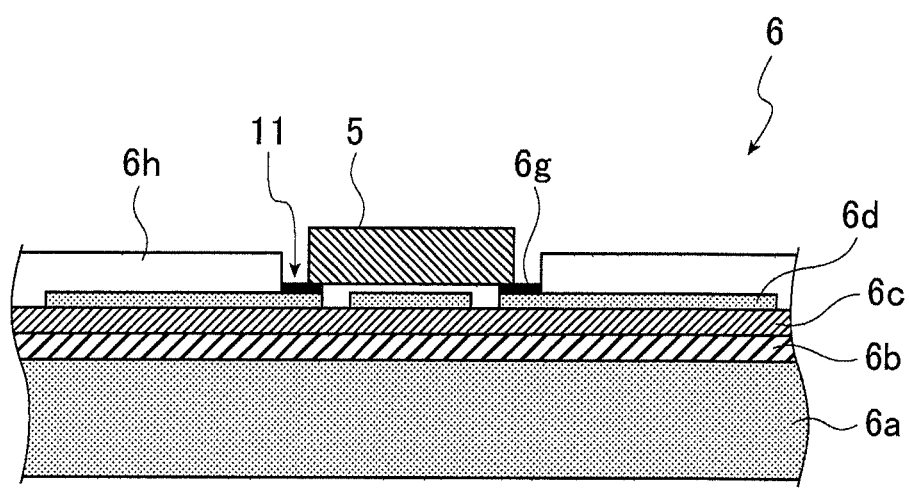
FIG. 2 is a sectional view showing how a light-emitting diode is mounted on a flexible printed circuit board according to the first embodiment of the present invention.

As the flexible printed circuit board 6, any flexible printed circuit board can be used as long as the flexible printed circuit board 6 can maintain its bent shape (U-shape). Examples of the flexible printed circuit board 6 which are excellent at maintaining a bent shape include a flexible printed circuit board which is formed by stacking, in order, a heat-conductive adhesive layer 6b, an insulating layer 6c made of a polyimide film, and a wiring layer 6d made of copper foil having a tensile strength of 250 MPa or less and a thickness of 50 μm or less on a heat-dissipating layer 6a made of copper foil having a tensile strength of 400 MPa or more and a thickness of 70 μm or more and coating and protecting, with a resist 6h, an upper portion of the wiring layer 6d except lands 6g where the light-emitting diodes 5 are to be mounted, as shown in FIG. 2. Note that although if the flexible printed circuit board 6 is subjected to heat treatment during the manufacturing process of the flexible printed circuit board 6, the heat treatment may change the tensile strength of copper foil, the term "tensile strength" here refers to tensile strength when the flexible printed circuit board 6 is in its finished form (after the flexible printed circuit board 6 undergoes a thermal history if the flexible printed circuit board 6 is subjected to heat treatment).

As described above, since the plurality of light-emitting diodes 5 are attached to the lands 6g of the flexible printed circuit boards 6 of the board assembly 3 such that the plurality of light-emitting diodes 5 can apply light in the directions different from each other, the light-emitting diode lamp 1 can illuminate a wide range. Additionally, the plurality of light-emitting diodes 5 are attached such that the irradiation areas of the light-emitting diodes 5 overlap with each other at the edges, occurrence of blind spots can be prevented.

The shape of each flexible printed circuit board 6 when developed into a plane has a simple shape, i.e., a substantially rectangular shape. If the flexible printed circuit boards 6 are laid out in a material sheet 12, as shown in FIG. 4, the number of flexible printed circuit boards 6 that can be laid out is large (as large as twelve in FIG. 4), and the yield rate of a material is high. Additionally, as described above, the two flexible printed circuit boards 6 have the same shape (U-shape) and, even when developed into a plane, have the same shape (substantially rectangular shape). There is no need to distinguish the two flexible printed circuit boards 6. Accordingly, the manufacturing costs of the flexible printed circuit board 6 can be reduced, which in turn leads to a reduction in the manufacturing costs of the light-emitting diode lamp 1.

Use of a flexible printed circuit board including the heat-dissipating layer 6a made of copper foil having a thickness of 70 μm or more as the flexible printed circuit board 6 allows sufficient dissipation of heat generated by the light-emitting diodes 5.

Use of a flexible printed circuit board including the heat-dissipating layer 6a made of copper foil having a tensile strength of 400 MPa or more as the flexible printed circuit board 6 makes the copper foil as the heat-dissipating layer 6a unlikely to be unevenly deformed (plastically deformed), e.g., during the manufacturing process of the flexible printed circuit board 6 and allows low-cost maintenance of the flatness of the flexible printed circuit board 6. That is, even when thick copper foil is adopted as the heat-dissipating layer 6a, if the copper foil is soft, the heat-dissipating layer 6a is easily unevenly deformed to lose its flatness. Accordingly, the heat-dissipating layer 6a needs to be planarized by using a corrective jig in order to prevent a failure from occurring when the light-emitting diodes 5 are mounted. However, adoption of copper foil having a tensile strength of 400 MPa or more and high elasticity as the heat-dissipating layer 6a prevents uneven deformation of the heat-dissipating layer 6a and eliminates the need to planarize the heat-dissipating layer 6a. This allows a reduction in the manufacturing costs of the flexible printed circuit board 6. Additionally, even after the flexible printed circuit board 6 is bent in a U-shape, the heat-dissipating layer 6a can serve as a skeletal frame which maintains the U-shape. Accordingly, when a circuit element (not shown) is mounted on the flexible printed circuit board 6, an attachment position and an attachment posture of the circuit element can be stabilized.

[Second Embodiment]

Figure 6:
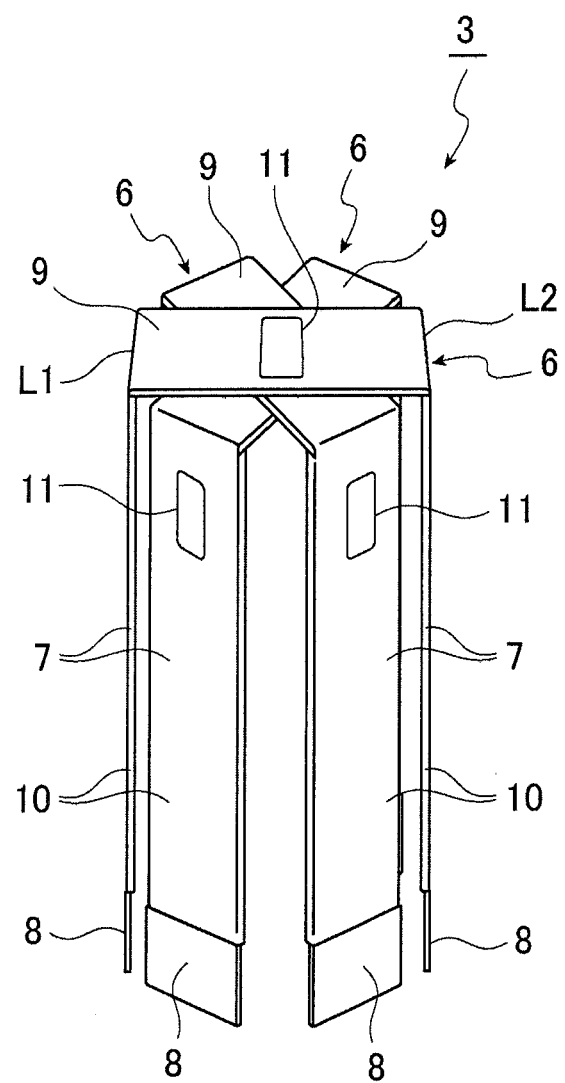
FIG. 6 is a perspective view of a board assembly according to a second embodiment of the present invention.

FIG. 6 shows a second embodiment of the present invention.

In the second embodiment, as shown in FIG. 6, the number of flexible printed circuit boards 6 constituting a board assembly 3 is three, and top surface portions 9 of the flexible printed circuit boards 6 are made to cross each other substantially at 60°. Note that a top one of the three flexible printed circuit boards 6 includes one light-emitting diode attaching portion 11 at each of respective predetermined positions of the top surface portion 9 and two side surface portions 10. The other two flexible printed circuit boards 6 each include one light-emitting diode attaching portion 11 at each of respective predetermined positions of the two side surface portions 10. The remainder of the configuration is the same as that in the first embodiment described above. Note that the same members as those in the first embodiment are denoted by the same reference numerals and that a description thereof will be omitted.

Accordingly, the second embodiment achieves the same working-effects as those of the first embodiment. In addition, since the top surface portions 9 of the three flexible printed circuit boards 6 cross each other at 60° in the second embodiment, light can be applied to surroundings more equally than in the first embodiment where the top surface portions 9 of the two flexible printed circuit boards 6 cross each other substantially at right angles. Moreover, the amount of light can be made larger in the second embodiment than in the first embodiment by an amount corresponding to an increase in the number of light-emitting diodes 5 to be attached.

In the second embodiment, the light-emitting 5 diodes on the board assembly 3 are arranged such that the light-emitting diodes 5 apply light in directions different from each other and such that irradiation areas of the light-emitting diodes 5 overlap with each other at edges, as in the first embodiment (see FIGS. 5A and 5B). With this configuration, in the second embodiment as well, occurrence of blind spots can be prevented.

Examples of the flexible printed circuit board 6 according to the second embodiment include a flexible printed circuit board (see FIG. 2) which is formed by stacking, in order, a heat-conductive adhesive layer 6b, an insulating layer 6c made of a polyimide film, and a wiring layer 6d made of copper foil having a tensile strength of 250 MPa or less and a thickness of 50 μm or less on a heat-dissipating layer 6a made of copper foil having a tensile strength of 400 MPa or more and a thickness of 70 μm or more and coating and protecting, with a resist 6h, an upper portion of the wiring layer 6d except lands 6g where the light-emitting diodes 5 are to be mounted, as in the first embodiment. Note that the term "tensile strength" in the second embodiment refers to tensile strength when the flexible printed circuit board 6 is in its finished form (after the flexible printed circuit board 6 undergoes a thermal history if the flexible printed circuit board 6 is subjected to heat treatment), as in the first embodiment.

As in the first embodiment, use of a flexible printed circuit board including the heat-dissipating layer 6a made of copper foil having a thickness of 70 μm or more as the flexible printed circuit board 6 allows Sufficient dissipation of heat generated by the light-emitting diodes 5. Also, as in the first embodiment, use of the heat-dissipating layer 6a made of copper foil having a tensile strength of 400 MPa or more makes the copper foil as the heat-dissipating layer 6a unlikely to be unevenly deformed (plastically deformed), e.g., during the manufacturing process of the flexible printed circuit board 6 and allows low-cost maintenance of the flatness of the flexible printed circuit board 6.

The board assembly 3 according to the second embodiment can also be mounted in a lighting unit 1 (see FIG. 1) which is the same as that in the first embodiment.

[Third Embodiment]

Figure 7:
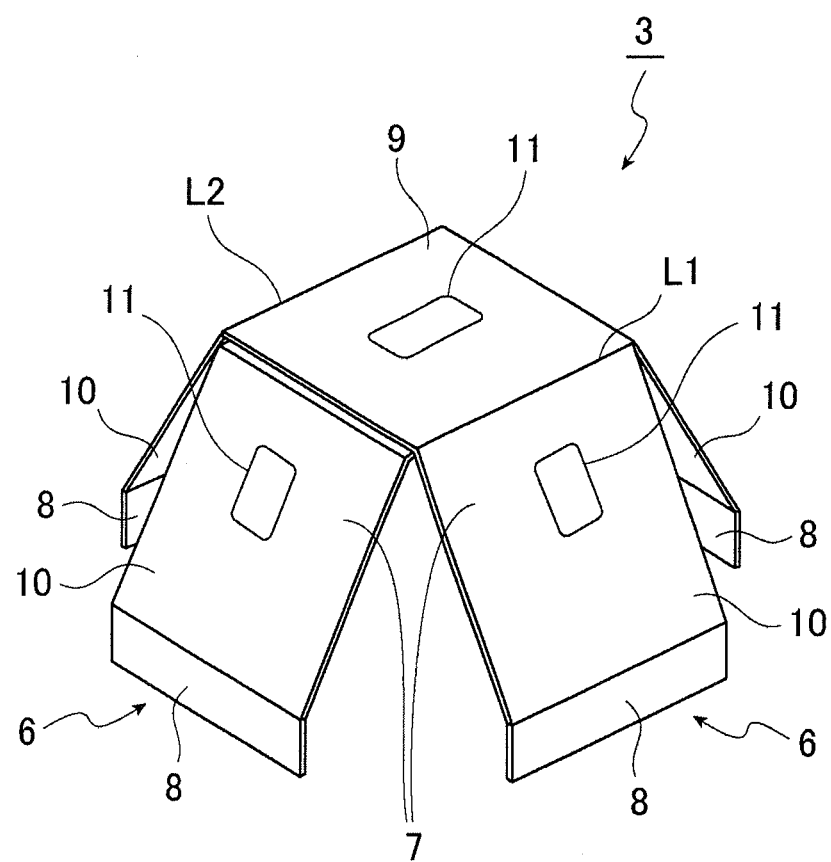
FIG. 7 is a perspective view of a board assembly according to a third embodiment of the present invention.

FIG. 7 shows a third embodiment of the present invention.

In the third embodiment, as shown in FIG. 7, a flexible printed circuit board 6 has a larger width, and an angle with respect to a top surface portion 9 at which side surface portions 10 are bent is an obtuse angle (e.g., about 120°). The remainder of the configuration is the same as that in the first embodiment described above. Note that the same members as those in the first embodiment are denoted by the same reference numerals and that a description thereof will be omitted.

Accordingly, the third embodiment achieves the same working-effects as those of the first embodiment. In addition, since the side surface portions 10 of the flexible printed circuit boards 6 are all tilted so as to face obliquely upward in the third embodiment, space above the flexible printed circuit boards 6 can be illuminated more satisfactorily than in the first embodiment.

In the third embodiment, light-emitting diodes 5 on a board assembly 3 are arranged such that the light-emitting diodes 5 apply light in directions different from each other and such that irradiation areas of the light-emitting diodes 5 overlap with each other at edges, as in the first embodiment (see FIGS. 5A and 5B). With this configuration, in the third embodiment as well, occurrence of blind spots can be prevented.

Examples of the flexible printed circuit board 6 according to the third embodiment include a flexible printed circuit board (see FIG. 2) which is formed by stacking, in order, a heat-conductive adhesive layer 6b, an insulating layer 6c made of a polyimide film, and a wiring layer 6d made of copper foil having a tensile strength of 250 MPa or less and a thickness of 50 μm or less on a heat-dissipating layer 6a made of copper foil having a tensile strength of 400 MPa or more and a thickness of 70 μm or more and coating and protecting, with a resist 6h, an upper portion of the wiring layer 6d except lands 6g where the light-emitting diodes 5 are to be mounted, as in the first embodiment. Note that the term "tensile strength" in the third embodiment refers to tensile strength when the flexible printed circuit board 6 is in its finished form (after the flexible printed circuit board 6 undergoes a thermal history if the flexible printed circuit board 6 is subjected to heat treatment), as in the first embodiment.

As in the first embodiment, use of a flexible printed circuit board including the heat-dissipating layer 6a made of copper foil having a thickness of 70 μm or more as the flexible printed circuit board 6 allows sufficient dissipation of heat generated by the light-emitting diodes 5. Also, as in the first embodiment, use of the heat-dissipating layer 6a made of copper foil having a tensile strength of 400 MPa or more makes the copper foil as the heat-dissipating layer 6a unlikely to be unevenly deformed (plastically deformed), e.g., during the manufacturing process of the flexible printed circuit board 6 and allows low-cost maintenance of the flatness of the flexible printed circuit board 6.

The board assembly 3 according to the third embodiment can also be mounted in a lighting unit 1 (see FIG. 1) which is the same as that in the first embodiment.

[Fourth Embodiment]

Figure 8A:
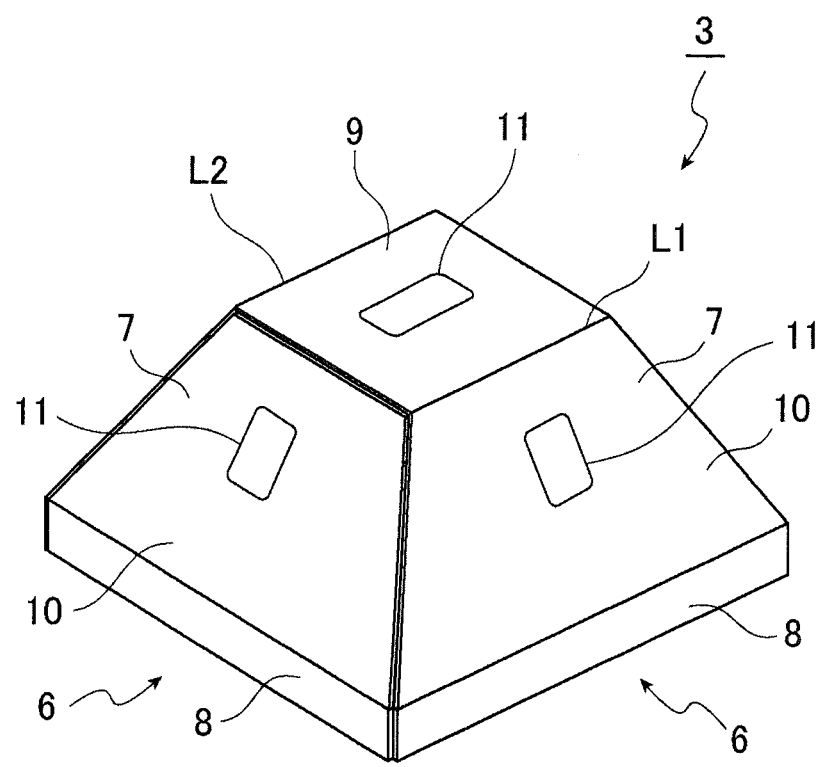
FIG. 8A is a perspective view of a board assembly according to a fourth embodiment of the present invention.
Figure 8B:
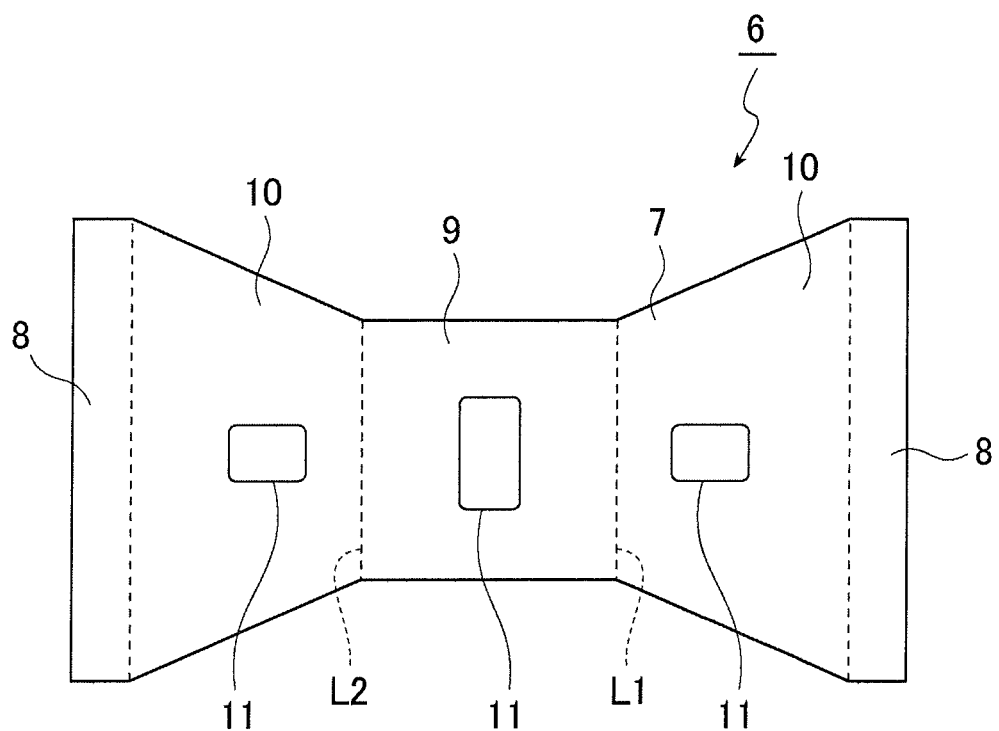
FIG. 8B is a developed view of a flexible printed circuit board of the board assembly according to the fourth embodiment of the present invention.

FIGS. 8A and 8B show a fourth embodiment of the present invention.

In the fourth embodiment, as shown in FIGS. 8A and 8B, the shape of a side surface portion 10 of a flexible printed circuit board 6 is substantially trapezoidal. The remainder of the configuration is the same as that in the third embodiment described above. Note that the same members as those in the third embodiment are denoted by the same reference numerals and that a description thereof will be omitted.

Accordingly, the fourth embodiment achieves the same working-effects as those of the third embodiment. In addition, the width of each side surface portion 10 in each flexible printed circuit board 6 increases from a top surface portion 9 toward a connection 8 in the fourth embodiment, as shown in FIGS. 8A and 8B. Accordingly, heat deterioration of light-emitting diodes 5 can be inhibited by efficiently transferring heat generated by the light-emitting diodes 5 to a lamp main body 2. Moreover, in the fourth embodiment, an angle with respect to the top surface portion 9 of each flexible printed circuit board 6 at which the side surface portions 10 are bent is about 120°, and corresponding edges of adjacent ones of the side surface portions 10 are in contact with each other. This configuration allows closing of gaps between the side surface portions 10 of the two flexible printed circuit boards 6. For this reason, space above the flexible printed circuit boards 6 can be further satisfactorily illuminated without letting dust enter a board assembly 3.

In the fourth embodiment, the light-emitting diodes on the board assembly 3 are arranged such that the light-emitting diodes apply light in directions different from each other and such that irradiation areas of the light-emitting diodes overlap with each other at edges, as in the first embodiment (see FIGS. 5A and 5B). With this configuration, in the fourth embodiment as well, occurrence of blind spots can be prevented.

Examples of the flexible printed circuit board 6 according to the fourth embodiment include a flexible printed circuit board (see FIG. 2) which is formed by stacking, in order, a heat-conductive adhesive layer 6b, an insulating layer 6c made of a polyimide film, and a wiring layer 6d made of copper foil having a tensile strength of 250 MPa or less and a thickness of 50 μm or less on a heat-dissipating layer 6a made of copper foil having a tensile strength of 400 MPa or more and a thickness of 70 μm or more and coating and protecting, with a resist 6h, an upper portion of the wiring layer 6d except lands 6g where the light-emitting diodes 5 are to be mounted, as in the first embodiment. Note that the term "tensile strength" in the fourth embodiment refers to tensile strength when the flexible printed circuit board 6 is in its finished form (after the flexible printed circuit board 6 undergoes a thermal history if the flexible printed circuit board 6 is subjected to heat treatment), as in the first embodiment.

As in the first embodiment, use of a flexible printed circuit board including the heat-dissipating layer 6a made of copper foil having a thickness of 70 μm or more as the flexible printed circuit board 6 allows sufficient dissipation of heat generated by the light-emitting diodes 5. Also, as in the first embodiment, use of the heat-dissipating layer 6a made of copper foil having a tensile strength of 400 MPa or more makes the copper foil as the heat-dissipating layer 6a unlikely to be unevenly deformed (plastically deformed), e.g., during the manufacturing process of the flexible printed circuit board 6 and allows low-cost maintenance of the flatness of the flexible printed circuit board 6.

The board assembly 3 according to the fourth embodiment can also be mounted in a lighting unit 1 (see FIG. 1) which is the same as that in the first embodiment.

[Fifth Embodiment]

Figure 9A:
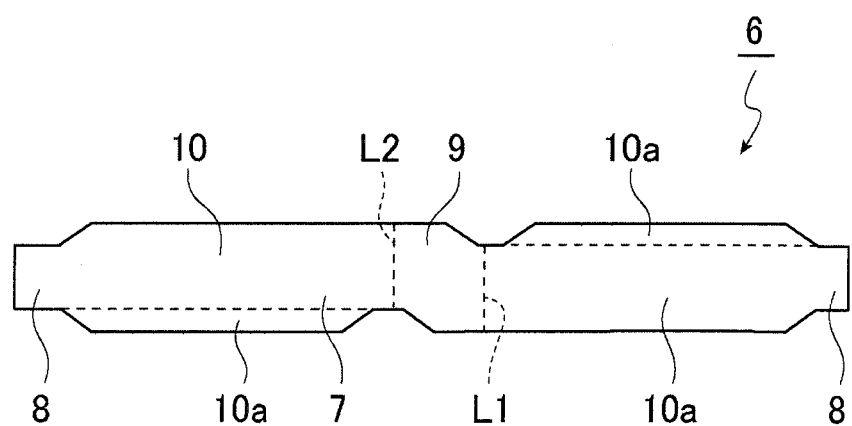
FIG. 9A is a developed view of a flexible printed circuit board according to a fifth embodiment of the present invention.
Figure 9B:
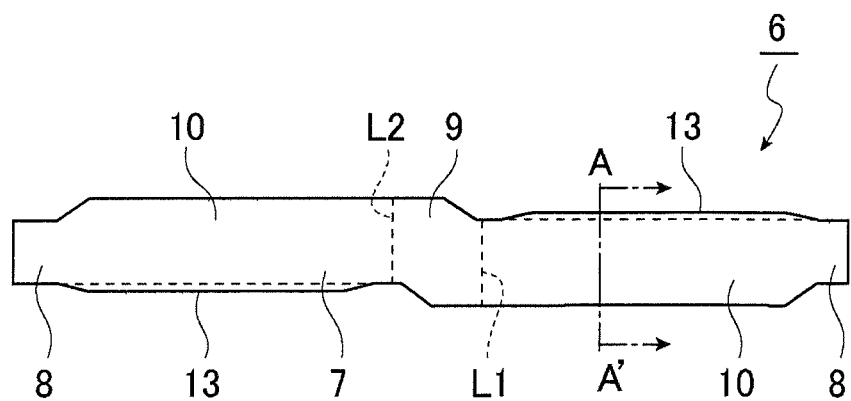
FIG. 9B is a plan view showing how ribs are formed at the flexible printed circuit board according to the fifth embodiment of the present invention.
Figure 9C:
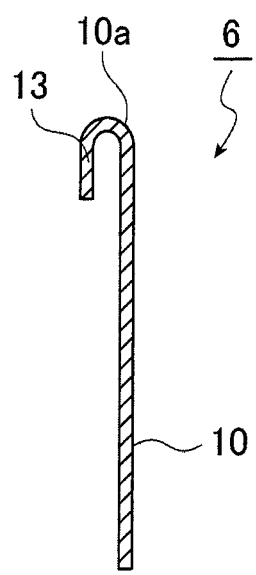
FIG. 9C is an enlarged sectional view of FIG. 9B taken along line A-A'.
Figure 10:
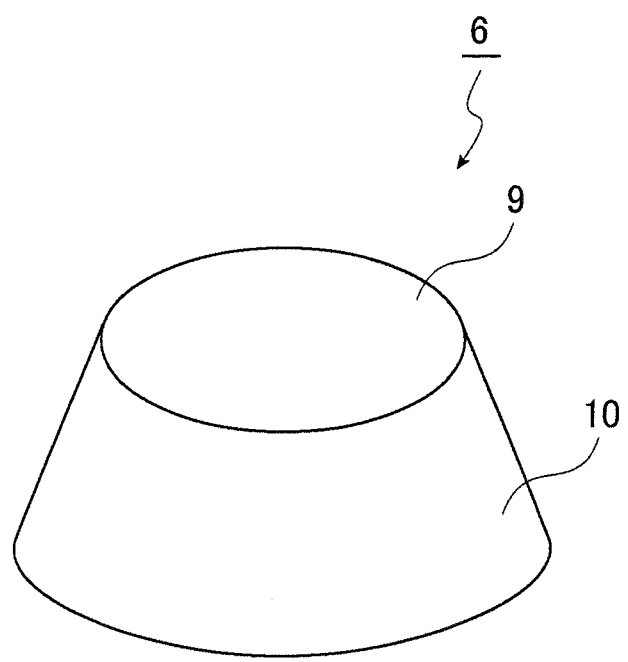
FIG. 10 is a perspective view illustrating a frusto-conical flexible printed circuit board.
Figure 11:
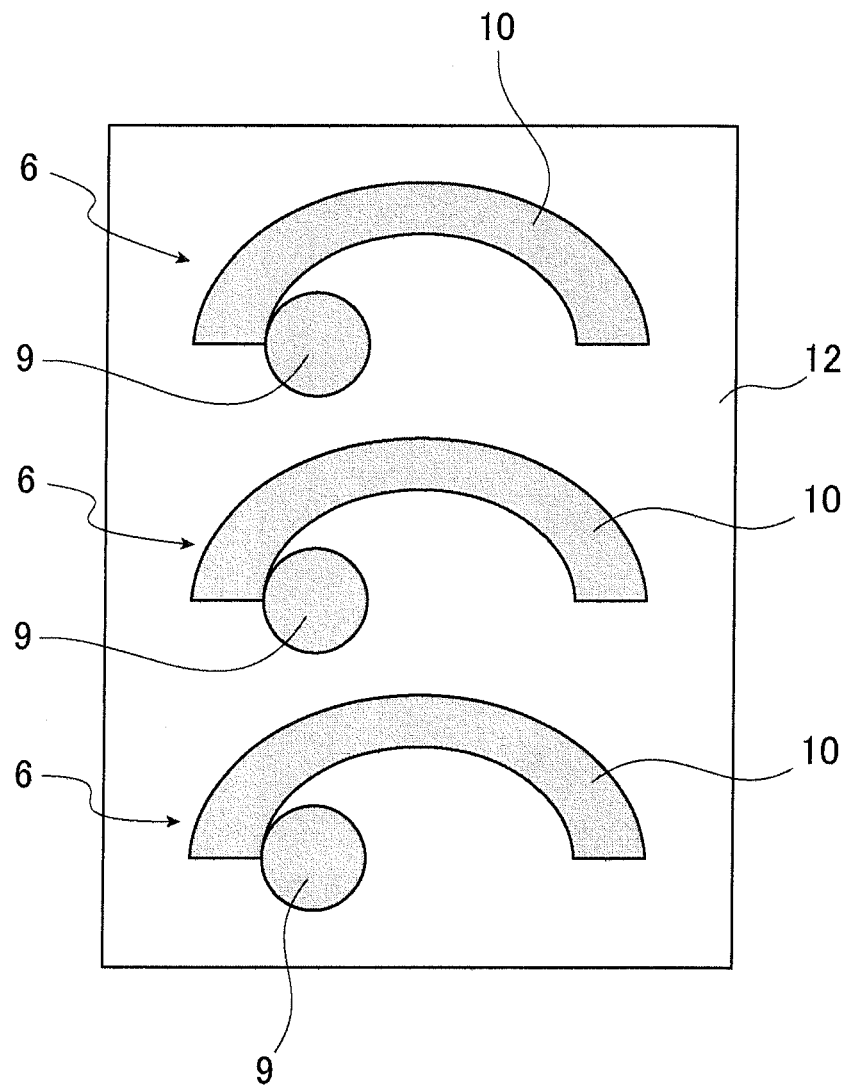
FIG. 11 is a plan view showing how the flexible printed circuit board shown in FIG. 10 is laid out in a material sheet.

FIGS. 9A to 9C show a fifth embodiment of the present invention.

In the fifth embodiment, as shown in FIGS. 9A to 9C, a rib 13 is formed along a side edge 10a of a side surface portion 10 of a flexible printed circuit board 6. The remainder of the configuration is the same as that in the first embodiment described above. Note that the same members as those in the first embodiment are denoted by the same reference numerals and that a description thereof will be omitted.

Accordingly, the fifth embodiment achieves the same working-effects as those of the first embodiment. In addition, since each side surface portion 10 of the flexible printed circuit board 6 is reinforced with the rib 13 in the fifth embodiment, the durability of the flexible printed circuit board 6 can be enhanced.

The flexible printed circuit board 6 including the ribs 13 can be applied to any of the board assemblies 3 according to the first to fourth embodiments.

[Other Embodiments]

Note that the above first to fifth embodiments each have described a case where one light-emitting diode 5 is attached to each of the top surface portion 9 and side surface portions 10 of the flexible printed circuit board 6. The number of light-emitting diodes 5 to be attached to each of the top surface portion 9 and side surface portions 10, however, is not limited to one.

Additionally, the first to fifth embodiments each have described the light-emitting diode lamp 1 including the flexible printed circuit board 6 bent at two points of a middle portion of the base 7. However, the base 7 may be bent at three or more points of a middle portion as long as the top surface portion 9 and side surface portions 10 are formed in the flexible printed circuit board 6.

Moreover, the first and third to fifth embodiments each have described a case where the board assembly 3 is composed of the two flexible printed circuit boards 6, and the second embodiment has described a case where the board assembly 3 is composed of the three flexible printed circuit boards 6. The number of flexible printed circuit boards 6 constituting the board assembly 3, however, is not limited to two or three. The number may be four or more.

Furthermore, the first to fifth embodiments each have described a case where the light-emitting diode lamp 1 is adopted as a lighting unit. However, the present invention can also be applied to a lighting unit other than the light-emitting diode lamp 1.

POSSIBILITY OF THE INDUSTRIAL UTILIZATION

The present invention can be applied to a wide range of lighting units which use a light-emitting diode as a light source, such as an electric bulb, a straight luminaire (e.g., a fluorescent lamp), a ceiling light, a lantern, a plant growth light, lighting machinery in a refrigerator-freezer, a portable flashlight, a headlight of a bicycle, various types of lights of an automobile (e.g., an interior light, a side marker light, a turn-signal light, and a parking light), a guide light, an emergency light, a warning light, a dental curing light, a garden lantern, a paper lantern, and a lamp for an aquarium.

REFERENCE SIGNS LIST 1 light-emitting diode lamp (lighting unit)
2 lamp main body (lighting unit main body)
3 board assembly
5 light-emitting diode
6 flexible printed circuit board
6a heat-dissipating layer
7 base
8 connection
9 top surface portion
10 side surface portion
10a side edge
11 light-emitting diode attaching portion
13 rib

What is claimed is:

1. A board assembly comprising a plurality of flexible printed circuit boards to which a light-emitting diode is attached and which are used in a lighting unit,
   wherein each of the flexible printed circuit boards includes a base in the form of a flat plate, respective connections to a power supply portion of the lighting unit are provided at two ends of the base, and the base is bent at a plurality of points of a middle portion to form a top surface portion and side surface portions, and
   the flexible printed circuit boards have substantially same shapes and are three-dimensionally assembled such that the top surface portions cross each other and such that one of the top surface portions lies on top of another.

2. The board assembly according to claim 1, wherein each flexible printed circuit board includes a heat-dissipating layer which is made of copper foil having a tensile strength of 400 MPa or more and a thickness of 70 µm or more.

3. The board assembly according to claim 1, wherein a top one of the plurality of flexible printed circuit boards includes a light-emitting diode attaching portion to which the light-emitting diode is attached at each of the top surface portion and the side surface portions, and the other flexible printed circuit boards each include a light-emitting diode attaching portion to which the light-emitting diode is attached at each of the side surface portions.

4. The board assembly according to claim 3, wherein the light-emitting diode attaching portions of the plurality of flexible printed circuit boards are set such that irradiation areas of the light-emitting diodes overlap with each other at edges when the light-emitting diodes are attached.

5. The board assembly according to claim 1, wherein a rib is formed along a side edge of each of the side surface portions in each flexible printed circuit board.

6. The board assembly according to claim 1, wherein each flexible printed circuit board includes a top surface portion having a substantially rectangular shape provided at a central portion and the respective side surface portions having a substantially rectangular shape provided so as to extend from two sides of the top surface portion in substantially perpendicular directions.

7. The board assembly according to claim 1, wherein each flexible printed circuit board includes a top surface portion having a substantially rectangular shape provided at a central portion and the respective side surface portions having a substantially rectangular shape provided so as to extend from two sides of the top surface portion in directions which form obtuse angles with the top surface portion.

8. The board assembly according to claim 1, wherein each flexible printed circuit board includes a top surface portion having a substantially rectangular shape provided at a central portion and the respective side surface portions having a substantially trapezoidal shape provided so as to extend from two sides of the top surface portion in directions which form obtuse angles with the top surface portion, and
   a gap between adjacent ones of the side surface portions is closed by bringing corresponding edges of the adjacent side surface portions into contact with each other.

9. A lighting unit wherein the board assembly according to claim 1 is disposed in a light unit main body, and the light-emitting diode is attached to the board assembly.

* * * * *